United States Patent [19]

Kobayashi

[11] Patent Number: 4,901,282

[45] Date of Patent: Feb. 13, 1990

[54] POWER EFFICIENT STATIC-COLUMN DRAM

[75] Inventor: Toshifumi Kobayashi, Itami, Japan

[73] Assignee: Mitsubishi Denki Kabushiki Kaisha, Tokyo, Japan

[21] Appl. No.: 328,814

[22] Filed: Mar. 24, 1989

Related U.S. Application Data

[63] Continuation of Ser. No. 901,057, Aug. 26, 1986, abandoned.

[30] Foreign Application Priority Data

Oct. 31, 1985 [JP] Japan .................................. 60-245114

[51] Int. Cl.⁴ ........................ G11C 7/00; G11C 8/00
[52] U.S. Cl. .................................. 365/222; 365/193; 365/189.01; 365/233
[58] Field of Search ............ 365/222, 193, 233, 189.01, 365/230.01

[56] References Cited

U.S. PATENT DOCUMENTS

| | | | |
|---|---|---|---|
| 4,142,233 | 2/1979 | Suzuki | 365/222 |
| 4,203,159 | 5/1980 | Wanlass | 365/222 |
| 4,207,618 | 6/1980 | White, Jr. et al. | 365/222 |
| 4,313,180 | 1/1982 | Mochizuki et al. | 365/222 |
| 4,403,308 | 9/1987 | Girard | 365/222 |
| 4,631,701 | 12/1986 | Kappeler et al. | 365/222 |
| 4,636,989 | 1/1987 | Ikuzaki | 365/222 |
| 4,672,583 | 6/1987 | Nakaizumi | 365/222 |
| 4,680,737 | 7/1987 | Oishi et al. | 365/222 |
| 4,701,843 | 10/1987 | Cohen | 364/200 |
| 4,725,945 | 2/1988 | Kronstadt et al. | 365/189 |
| 4,748,627 | 5/1988 | Ohsawa | 365/222 |

FOREIGN PATENT DOCUMENTS

0036579 9/1984 European Pat. Off. .
2516124 3/1983 Fed. Rep. of Germany .

OTHER PUBLICATIONS

Baba et al., "A 64K DRAM with 35 ns Static Column Operation," 18, Journal of Solid-State Circuits, 447, (1983).
B. Normann, "Static Column RAM Almost Doubles Data Rates," Electronic Design, Feb. 23, 1984, at 259.
Baba et al., "A 35 ns 64K Static Column DRAM", 1983 IEEE Int'l Solid-State Circuits Conf. Dig. Tech. Papers, Feb. 23, 1983, at 64.

Primary Examiner—Stuart N. Hecker
Assistant Examiner—Melissa J. Koval
Attorney, Agent, or Firm—Saidman, Sterne, Kessler & Goldstein

[57] ABSTRACT

In a static column dynamic random access memory device in which memory operations including refresh operation are initiated responsive to a row address strobe signal, and the refresh operation for amplification and rewriting of information of the selected memory cell is not interrupted until its completion once it is started by the application of the row address strobe signal even if the row address strobe signal is thereafter removed;

a timing circuit provides clocks for controlling the row circuits and the column circuit to cause termination of the memory operations if the row address strobe signal has been removed before the end of the refresh operation, and to cause continuation of the read/write memory operations if the row address strobe signal is still applied at the end of the refresh operation.

11 Claims, 3 Drawing Sheets

POWER EFFICIENT STATIC-COLUMN DRAM

This application is a continuation of application Ser. No. 06/901,057, filed 08/26/86 now abandoned.

BACKGROUND OF THE INVENTION

The present invention relates to a static column dynamic random access memory device and aims at reducing the power consumption in such a memory device.

In recent years, the demand for a dynamic random access memory device (hereinafter referred to as a DRAM) with a higher speed has been increasing. One solution to meet this demand is a static column DRAM, as disclosed in Nikkei Electronics (1983, Vol. 9, No. 12, pp 153-174, published in Japan).

In the static column DRAM, once the row address has been latched within the chip by means of a row address strobe signal (hereinafter referred to as a RAS chip signal), a high speed access (as in a static RAM) to the row whose row address has been latched can be made responsive to a column address, and the static column DRAM does not require a column address strobe signal (hereinafter referred to as a CAS signal) which the conventional DRAM required. The columns circuits of the static column DRAM are therefore automatically activated after the completion of the row circuits' operation which was initiated upon the RAS signal falling to "L" level. To alleviate restrictions on timing in use, it is generally arranged so that, once a series of the operations in a memory cycle are started (upon the $\overline{RAS}$ signal falling to "L"), the memory operations are not interrupted until the end even if the $\overline{RAS}$ signal is raised to "H" in the middle of the operations.

An example of a prior art static column DRAM is shown in FIGS. 1A and 1B. As shown, it comprises a memory cell array 1 comprising a plurality of memory cells MC arranged in rows and columns to form a matrix, a row decoder 2 for selecting the word lines WL, a row address buffer 3, a row of sense amplifiers 4 amplifying the information read from the memory cells onto the respective bit lines BL, an input/output gate 5, a column decoder 6, a column address buffer 7, a data output buffer 8, a data input buffer 9, a row timing control circuit 10, a write control circuit 11, an output control circuit 12, an inverter 21 and an OR gate 22.

$\overline{RAS}$ denotes the $\overline{RAS}$ signal. $\overline{WE}$ and $\overline{CS}$ respectively denote a write signal and a chip select signal. These control signals are supplied from outside. ΦRAS denotes an internal RAS (row address strobe) clock. ΦRA denotes a clock for latching the row address in the row address buffer 3. ΦWL denotes a clock for activating the word line which has been selected by the row decoder 2. ΦSA is a clock for activating the sense amplifiers 4. ΦREF denotes a clock indicating that a refresh operation is under execution. ΦCE denotes a clock for activating the column circuits. ΦWR denotes a clock for write control. ΦWC denotes a clock indicating that a write operation is under execution. ΦOE is a clock for output control.

The operations of the memory shown in FIGS. 1A and 1B will now be described with reference to FIG. 2. At time t1, the $\overline{RAS}$ signal falls to "L". The clock ΦRAS, and then the clocks ΦREF and ΦRA rise to "H". The row address is latched by the row address buffer 3, and decoding by the row decoder 2 is conducted. Upon completion of the decoding, the clock ΦWL rises and the word line designated by the row address is activated. The information stored in the memory cells connected to the selected word line is read out onto the bit lines BL, after which the clock ΦSA rises to "H" so that the sense amplifiers 4 start refreshing the information.

At time t2, the refreshing is completed. Then, the clock ΦREF falls to "L" and the clock ΦCE simultaneously rises to "H". As shown in FIG. 1, the clock ΦRAS is a logical sum (OR) of the inversion of the $\overline{RAS}$ signal and the clocks ΦREF and ΦWC. As a result, once the clock ΦREF rises to "H" (because of the $\overline{RAS}$ signal of "L"), the refresh operation is completed even if the $\overline{RAS}$ signal rises to "H" before the time t2, as illustrated by the solid lines in FIG. 2. If the $\overline{RAS}$ signal is held "L" until the time t3, i.e., after t2, as illustrated by the broken lines in FIG. 2, the $\overline{CS}$ signal and $\overline{WE}$ signal are kept supplied, so that read/write memory operations can be conductive (not illustrated).

In the prior art memory, the clock ΦCE for activating the column circuits is triggered upon the clock ΦREF falling indicating completion of the refresh operation. As a result, in a $\overline{RAS}$ only refresh cycle in which only the refreshing is required and the column circuits need not operate, there is a period in which the clock ΦCE is at "H". During this period, unnecessary power consumption occurs in the column circuits.

SUMMARY OF THE INVENTION

An object of the invention is to eliminate the unnecessary power consumption in $\overline{RAS}$ only refresh cycles, i.e., to provide a DRAM consuming a smaller power.

According to the invention, there is provided a DRAM characterized by a timing control circuit provided with an RS flip-flop which is set by a logical product (AND) of the clock indicating the end of a refresh cycle and the $\overline{RAS}$ signal or its inversion, and producing a clock for activating the column circuits.

As the clock for activating the column circuits is produced from an RS flip-flop which is triggered by the logical product of the clock indicating the end of the refresh cycle and the $\overline{RAS}$ signal or its inversion, the column circuits are not activated in a $\overline{RAS}$ only refresh cycle if the $\overline{RAS}$ signal is raised to "H" before the end of refreshing operation indicating that it is the $\overline{RAS}$ only refresh cycle.

BRIEF DESCRIPTION OF THE DRAWINGS

In the accompanying drawings.

comprising FIGS. 1A and 1B, block diagrams showing an example of a prior art static column DRAM.

comprising FIGS. 3A and 3B block diagrams showing an embodiment of a static column DRAM according to the present invention.

DETAILED DESCRIPTION OF THE PREFERRED EMBODIMENTS

Figure 1A:
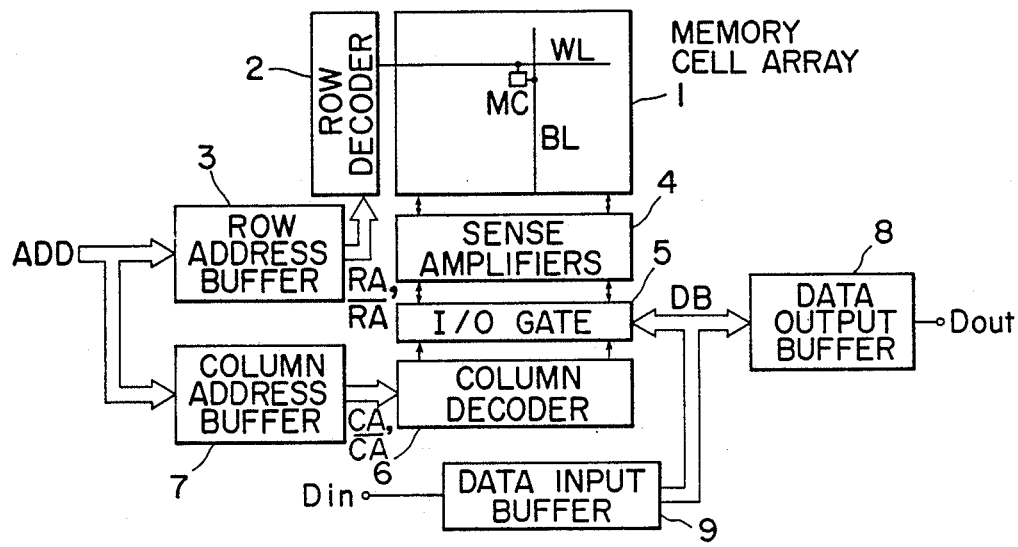
Figure 1B:
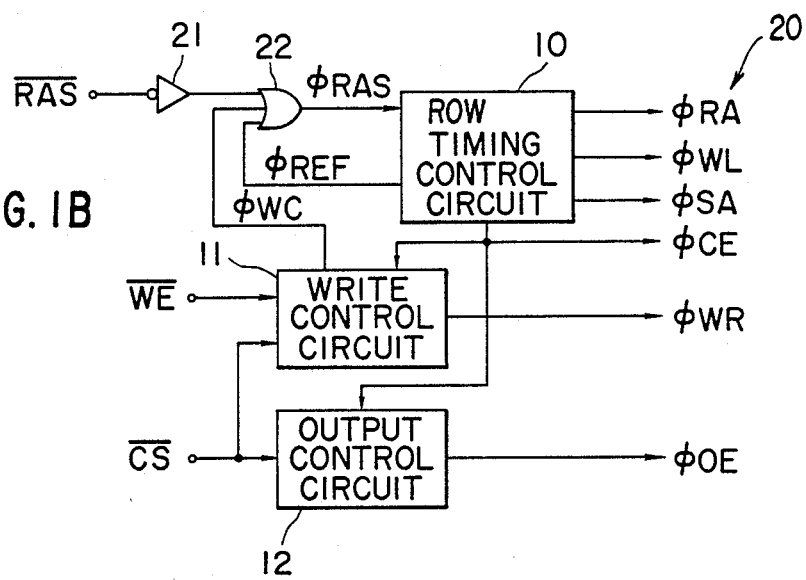
Figure 2:
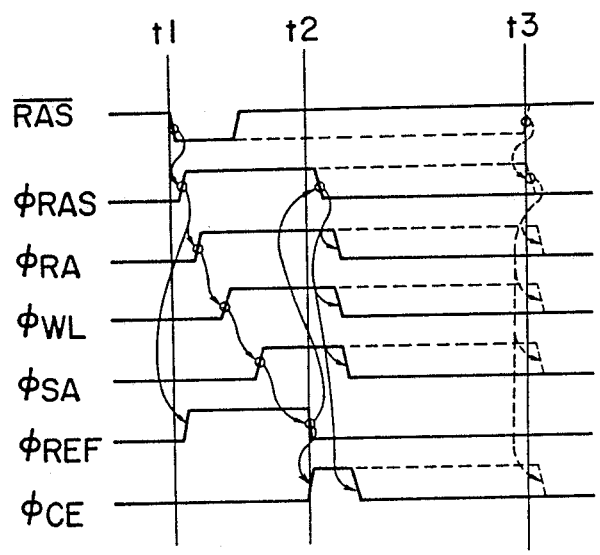
FIG. 2 is a timing chart showing the operations of the DRAM of FIGS. 1A and 1B.
Figure 3A:
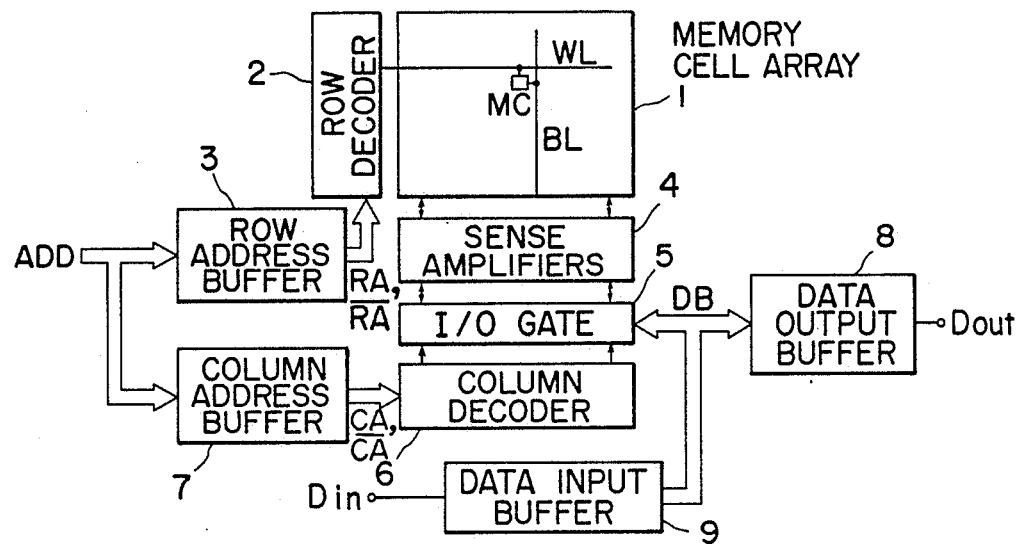
Figure 3B:
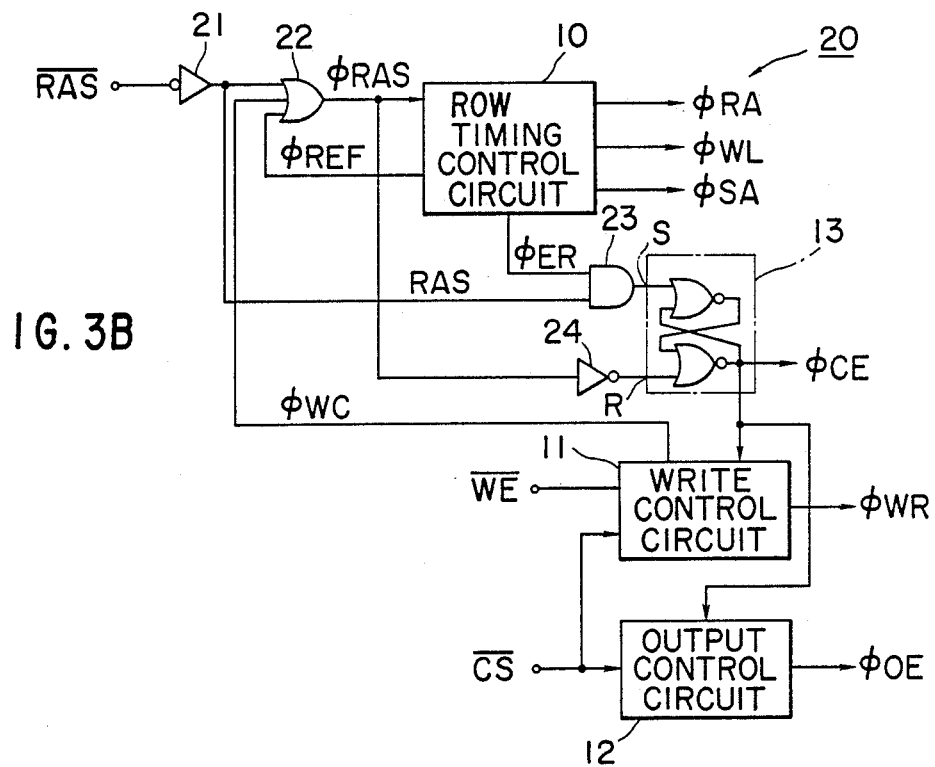

Referring now more particularly to FIGS. 3A and 3B, there is shown an embodiment of a static column DRAM according to the present invention. In FIGS. 3A and 3B, the reference numerals 1-12, 21 and 22 denote identical or similar components to those shown in FIGS. 1A and 1B. Similarly, the reference marks on the signals and the clocks denote the identical or similar signals or clocks to those shown in FIG. 1.

According to the invention, an RS flip-flop 13 is provided, and connected to be set by an output of an AND gate 23 receiving an inversion (RAS) of the $\overline{RAS}$ signal and the clock ΦER indicating the end of the refresh operation. In other words, the RS flip-flop 13 is set by the logical product of the inversion of the $\overline{RAS}$ signal and the clock ΦER. The RS flip-flop 13 is also connected to be reset by the output of an inverter 24 receiving the clock ΦRAS, i.e., by the inversion of the clock ΦRAS. The circuits 10–13, and 21–24 in combination form a timing control circuit 20, which controls the row circuits and the column circuits in such a manner as to terminate the memory operations if the row address strobe signal has been removed before the end of the refresh operation, and to continue the memory operations if the row address strobe signal is still applied at the end of the refresh operation.

Figure 4:
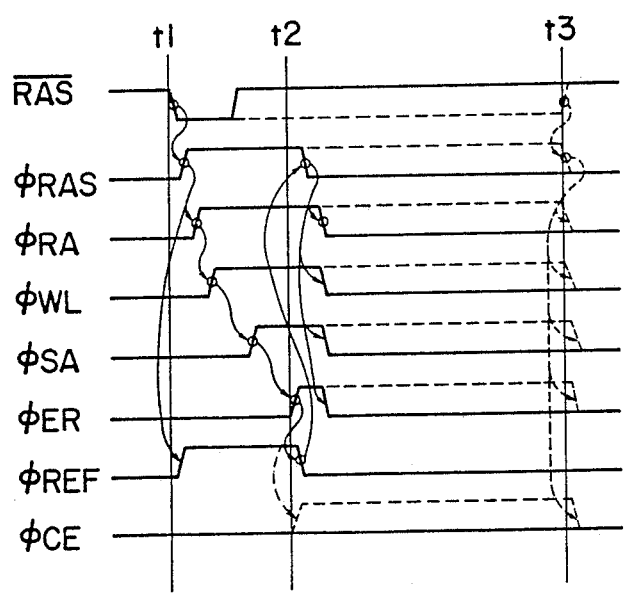
FIG. 4 is a timing chart showing the operations of the DRAM of FIGS. 3A and 3B.

FIG. 4 shows operations of the memory of FIGS. 3A and 3B. The operations from the time t1 when the $\overline{RAS}$ signal falls to "L" until the time when the clock ΦSA for activating the sense amplifiers 4 rises to "H" are similar to those of the prior art memory of FIG. 1. When the sense amplifiers 4 complete the refresh at the time t2, the clock ΦER rises to "H" and hence the clock ΦREF falls to "L".

If, as shown by the solid line in FIG. 4, the $\overline{RAS}$ signal rises to "H" before t2, i.e., before the rise of the clock ΦER, the output of the AND gate 23 (the signal for setting the RS flip-flop 13) is not produced, and the clock ΦCE is held at "L", and the memory operations are completed while the column circuits are kept inactive.

Thus, in a $\overline{RAS}$ only refresh cycle, the $\overline{RAS}$ signal is raised to "H" before t2, so that the cycle is terminated without the column circuits being activated.

If, as shown by broken lines in FIG. 4, the $\overline{RAS}$ signal is held at "L" until t3, after t2, the output of the AND gate 23 rises to "H" when the clock ΦER rises to "H". The RS flip-flop 13 is therefore set (at about t2), so that the clock ΦCE rises to "H". Read/write operations can be conducted during the priod of from t2 to t3. The RS flip-flop 13 is reset when the clock ΦRAS falls to "L".

As has been described, according to the invention, if the row address strobe signal is removed before the end of the refresh operation, the memory operations are terminated and the column circuits are not activated. The unnecessary power consumption which occurs when effecting the refresh cycle in the prior art memory can therefore be eliminated.

What is claimed is:

1. A static column dynamic random access memory device comprising:
    a plurality of memory cells arranged in rows and columns;
    means to initiate memory operations involving said memory cells, said memory operations including read/write and refresh operations;
    timing circuit means, to provide clocks for controlling means to initiate memory operations;
    wherein said timing circuit means comprises
    (a) means to receive a row address strobe signal;
    (b) means, in communication with said means to receive a row address strobe signal, for terminating memory operations other than said refresh operation if said row address strobe signal has been removed before the end of said refresh operation, and
    (c) means, in communication with said means to receive a row address strobe signal, for causing continuation of said read/write operations if said row address strobe signal is still applied at the end of said refresh operation.

2. A device according to claim 1, wherein said timing circuit comprises
    a row timing circuit producing
        a clock for activating said row circuits,
        and a signal indicating the end of the refresh operation, and
    an RS flip-flop
        which is connected to be triggered by a signal representing a logical product of
            said signal indicating the end of the refresh operation and
            the row address strobe signal or its inversion,
        and which is connected to produce a clock for activating said column circuits.

3. A device according to claim 1, wherein said timing control circuit comprises
    means, responsive to the row address strobe signal, for providing said row circuits with a row address strobe clock which is kept present, from the application of the row address strobe signal, until at least the end of the refresh operation.

4. A device according to claim 3, wherein said row address strobe signal clock providing means further provides a refresh end signal indicating the end of the refresh operation, and wherein said timing control circuit further comprises
    means for producing a logical product signal representing the logical product of the refresh end signal and the row address strobe signal or its inversion, and
    an RS flip-flop connected to be set by said logical product signal to produce a clock for activating the column circuits.

5. A device according to claim 4, wherein said RS flip-flop is connected to be reset when the memory operations are completed.

6. A device according to claim 1, wherein said timing control circuit further comprises
    means for providing a refresh end signal indicating the end of the refresh operation, and
    means for producing a logical product signal representing the logical product of the refresh end signal and the row address strobe signal or its inversion, and
    an RS flip-flop connected to be set by said logical product signal to produce a clock for activating said column circuits.

7. A method of operating a static column dynamic random access memory device comprising the steps of:
    (1) initiating a refresh memory operation to a selected row of memory cells in said static column dynamic random access memory in response to assertion of a row address strobe signal;
    (2) detecting whether said row address signal is still asserted at the end of said refresh operation;
    (3) initiating read/write memory operations from/to said selected row of memory cells if it is detected that said row address strobe signal is still asserted at the end of the refresh operation;
    (4) terminating memory operations if it is detected that said row address strobe signal is not asserted at the end of said refresh operation.

8. An integrated circuit memory, comprising:
at least one array of memory cells arranged in rows and columns;
row circuit means, in communication with said at least one array of memory cells, for selecting memory cells in accordance with row address signals;
column circuit means, in communication with said at least one array of memory cells, for selecting memory cells in accordance with column address signals;
means responsive to a row address strobe line for causing a row address to be latched into said row circuit means when said row address strobe line has a first state; and
a column timing control circuit, in communication with said row address strobe line, comprising:
 (a) means for activating said column circuit means after said row address strobe line has taken said first state, and
 (b) means for inhibiting activation of said column circuit means after said row address has been latched into said address latches during a refresh cycle, unless said address strobe line continues to have said refresh state.

9. The memory of claim 8, wherein said memory further comprises one data output buffer which selectably outputs data read out from a selected one of said cells.

10. The memory of claim 8, wherein said address strobe line, in combination with one other of a plurality of lines connected to said memory, provide states including:
 said first state of said address strobe line;
 incremental addressing via change of only one portion of a multiplexed address;
 an an inactive condition.

11. A static column dynamic random access memory device comprising:
a plurality of memory cells arranged in rows and columns;
means to receive a row address strobe signal;
means to initiate memory cycles in response to said row address strobe signal, said memory cycles beginning with a refresh operation to a selected row of said memory cells, followed by read/write operations from/to said selected row of said memory cells;
timing circuit means, to provide clocks for controlling said memory cycles;
wherein said timing circuit means comprises
 (a) means, in communication with said means to receive a row address strobe signal, for terminating memory cycles if said row address strobe signal has been removed before the end of said refresh operation; and
 (b) means, in communication with said means to receive a row address strobe signal, for causing initiation of said read/write operations if said row address strobe signal is still applied at the end of said refresh operation.

* * * * *